United States Patent
Ryu et al.

(10) Patent No.: US 9,429,838 B2
(45) Date of Patent: Aug. 30, 2016

(54) PHOTOSENSITIVE RESIN COMPOSITION FOR COLOR FILTER AND COLOR FILTER USING THE SAME

(71) Applicant: Cheil Industries Inc., Gumi-si (KR)

(72) Inventors: Jee-Hyun Ryu, Uiwang-si (KR); In-Jae Lee, Uiwang-si (KR); Ji-Young Jeong, Uiwang-si (KR); Plueg Carsten, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 318 days.

(21) Appl. No.: 13/962,351

(22) Filed: Aug. 8, 2013

(65) Prior Publication Data
US 2014/0175344 A1 Jun. 26, 2014

(30) Foreign Application Priority Data
Dec. 26, 2012 (KR) .................. 10-2012-0153560

(51) Int. Cl.
*G02B 5/23* (2006.01)
*G03F 7/00* (2006.01)
*G02B 5/20* (2006.01)
*G03F 7/027* (2006.01)
*G03F 7/033* (2006.01)

(52) U.S. Cl.
CPC ............ *G03F 7/0007* (2013.01); *G02B 5/201* (2013.01); *G03F 7/027* (2013.01); *G03F 7/033* (2013.01)

(58) Field of Classification Search
USPC ................................. 252/586, 582
See application file for complete search history.

(56) References Cited

U.S. PATENT DOCUMENTS

| | | |
|---|---|---|
| 4,006,178 A | 2/1977 | Stagi et al. |
| 6,033,813 A | 3/2000 | Endo et al. |
| 6,733,935 B2 | 5/2004 | Kishimoto et al. |
| 7,193,001 B2 | 3/2007 | Christensen et al. |
| 7,399,566 B2 | 7/2008 | Padunchwit et al. |
| 7,517,619 B2 | 4/2009 | Hosaka et al. |
| 8,282,862 B1 * | 10/2012 | Kim .................. C09B 11/24 252/582 |
| 8,735,025 B2 | 5/2014 | Kim et al. |
| 2007/0117031 A1 | 5/2007 | Mizukawa et al. |
| 2011/0250531 A1 | 10/2011 | Kwon et al. |
| 2012/0242940 A1 | 9/2012 | Nagata et al. |

FOREIGN PATENT DOCUMENTS

| | | |
|---|---|---|
| JP | 06-041458 A | 2/1994 |
| JP | 06-087275 A | 3/1994 |
| JP | 07-140654 A | 6/1995 |
| JP | 10-254133 A | 9/1998 |
| JP | 2000-095805 A | 4/2000 |
| JP | 2005-250420 A | 9/2005 |
| JP | 2007-057658 A | 3/2007 |
| JP | 2009-251563 A | 10/2009 |
| JP | 4955576 B2 | 3/2012 |
| KR | 10-0140908 B1 | 6/1998 |
| KR | 10-1999-0007097 A | 1/1999 |
| KR | 10-2002-0015650 A | 2/2002 |
| KR | 10-2005-0020653 A | 3/2005 |
| KR | 10-2009-0106226 A | 10/2009 |
| KR | 1020090106226 * | 10/2009 |
| KR | 10-2010-0078845 A | 7/2010 |
| KR | 10-2010-0080142 A | 7/2010 |
| KR | 10-2011-0112696 A | 10/2011 |
| KR | 10-2012-0022669 A | 3/2012 |
| TW | 2009-03044 A | 1/2009 |
| WO | 2006/078616 A1 | 7/2006 |

OTHER PUBLICATIONS

Search Report in counterpart Taiwanese Application No. 102128841 dated Oct. 20, 2014, pp. 1.
English Translation of Search Report in counterpart Taiwanese Application No. 102128841 dated Oct. 20, 2014, pp. 1.
Search Report in counterpart Chinese Application No. 201310341986.4 dated May 25, 2016, pp. 1-2.

* cited by examiner

*Primary Examiner* — Monique Peets
(74) *Attorney, Agent, or Firm* — Additon, Higgins & Pendleton, P.A.

(57) ABSTRACT

Disclosed are a photosensitive resin composition for a color filter including (A) a colorant including a compound represented by Chemical Formula 1 and/or a compound including repeating units represented by Chemical Formula 2 and Chemical Formula 3, wherein Chemical Formula 1, Chemical Formula 2, and Chemical Formula 3 are the same as defined in the specification; (B) a binder resin; (C) a photopolymerizable monomer; (D) a photopolymerization initiator; and (E) a solvent, and a color filter using the same.

6 Claims, No Drawings

PHOTOSENSITIVE RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2012-0153560 filed in the Korean Intellectual Property Office on Dec. 26, 2012, the entire disclosure of which is incorporated herein by reference.

FIELD

This disclosure relates to a photosensitive resin composition for a color filter and a color filter using the same.

BACKGROUND

Liquid crystal displays can have various advantages such as lightness, thinness, low cost, low power consumption for operation, and improved adherence to an integrated circuit. Liquid crystal displays have been widely used in laptop computers, monitors, and TV screens.

Liquid crystal displays include a color filter formed by repeating a unit pixel, in which three primary color sub-pixels of red (R), green (G), and blue (B) are combined. The unit pixel displays a particular color due to the combination of three primary colors when each sub-pixel is adjacently disposed and then, applied by a color signal and controlled about brightness.

The color filter is made of red (R), green (G), and blue (B) color dyes or pigments. These color materials change white light from a backlight unit into each corresponding color light.

Because the color materials have a spectrum with no unnecessary wavelength other than a required absorption wavelength and a smaller absorption band, display performance of the color filter may be improved. In addition, the color materials are required to have excellent heat resistance, light resistance, and chemical resistance without being faded or discolored when exposed to ultraviolet (UV), acid, and/or base during etching of a color resist.

The color filter can be manufactured using a photosensitive resin composition by dyeing, electrophoretic deposition (EPD), printing, pigment dispersion, and the like, in which three or more colors are coated on a transparent substrate. There have been recent improvements to the pigment dispersion method to provide improved color reproducibility and durability for heat, light, and humidity and thus, pigment dispersion methods have been widely adopted.

However, when a pigment-type photosensitive resin composition is used to manufacture a color filter, the color filter has a limit of deteriorated luminance and contrast ratio due to sizes and cohesion of pigment particles. In order to improve these limits, research has been conducted on a photosensitive resin composition including a dye that does not form a particle or has a very smaller primary particle diameter. However, the dye-type photosensitive resin composition can have poor heat resistance, light resistance, and chemical resistance and has limited commercial availability. Accordingly, there is a need to improve the reliability of dye-type photosensitive resin compositions for commercial availability.

SUMMARY

One embodiment provides a photosensitive resin composition for a color filter that can have high luminance and contrast ratio, and improved heat resistance and chemical resistance.

Another embodiment provides a color filter manufactured using the photosensitive resin composition for a color filter.

One embodiment may include a photosensitive resin composition for a color filter that includes (A) a colorant including a compound represented by the following Chemical Formula 1, a compound including repeating units represented by the following Chemical Formula 2 and the following Chemical Formula 3, or a combination thereof; (B) a binder resin; (C) a photopolymerizable monomer; (D) a photopolymerization initiator; and (E) a solvent.

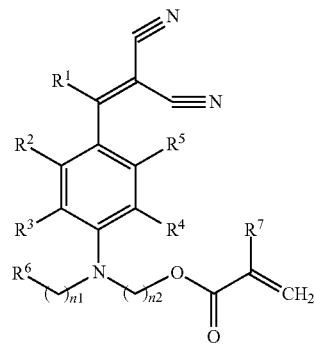

[Chemical Formula 1]

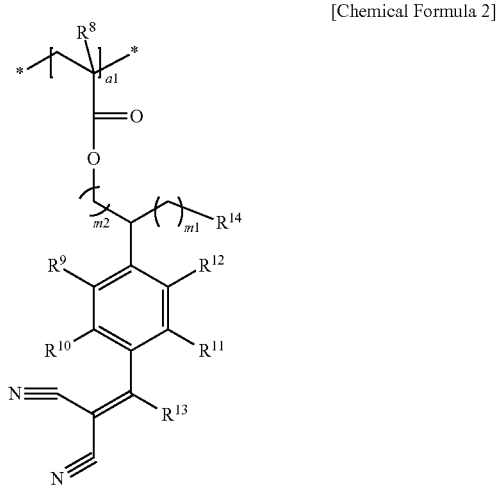

[Chemical Formula 2]

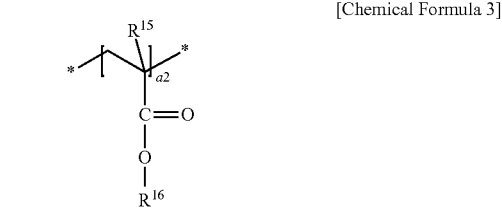

[Chemical Formula 3]

In the above Chemical Formulae 1 to 3, $R^1$ to $R^6$ and $R^9$ to $R^{14}$ are the same or different and are each independently hydrogen, substituted or unsubstituted C1 to C20 alkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^7$, $R^8$ and $R^{15}$ are the same or different and are each independently hydrogen or substituted or unsubstituted C1 to C20 alkyl, $R^{16}$ is hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $n^1$, $n^2$, $m^1$ and $m^2$ are the same or different and are each independently integers ranging from 1 to 10, and $a^1$ and $a^2$ are the same or different and are each independently integers ranging from 1 to 50.

The compound including repeating units represented by the above Chemical Formula 2 and Chemical Formula 3 may have a weight average molecular weight of about 5,000 to about 20,000 g/mol.

The colorant may further include at least one dye such as a triarylmethane-based dye, an anthraquinone-based dye, a benzylidene-based dye, a cyanine-based dye, a phthalocyanine-based dye, an azaporphyrin-based dye, an indigo-based dye, a xanthene-based dye, or a combination thereof.

The colorant may further include a pigment.

The photosensitive resin composition for a color filter may include about 0.1 to about 60 wt % of the colorant (A); about 0.1 to about 30 wt % of the binder resin (B); about 0.1 to about 30 wt % of the photopolymerizable monomer (C); about 0.1 to about 10 wt % of the photopolymerization initiator (D); and a balance amount of the solvent (E).

Another embodiment provides a color filter manufactured using the photosensitive resin composition for a color filter.

Other embodiments are included in the following detailed description.

The color filter can have high luminance and contrast ratio and thus can have improved heat resistance and chemical resistance.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof, instead of at least one hydrogen.

As used herein, when a specific definition is not otherwise provided, the "heterocycloalkyl group", "heterocycloalkenyl group", "heterocycloalkynyl group" and "heterocycloalkylene group" may refer to cyclic compounds of cycloalkyl, cycloalkenyl, cycloalkynyl and cycloalkylene in which at least one heteroatom of N, O, S, and/or P is present in place of a carbon atom of the cyclic compound.

As used herein, when a specific definition is not otherwise provided, "(meth)acrylate" refers to both "acrylate" and "methacrylate".

The photosensitive resin composition for a color filter according to one embodiment includes (A) a colorant, and optionally (B) a binder resin, (C) a photopolymerizable monomer, (D) a photopolymerization initiator, and (E) a solvent.

Hereinafter, each component is described in detail.

(A) Colorant

The colorant according to one embodiment includes a compound represented by the following Chemical Formula 1, a compound including repeating units represented by the following Chemical Formula 2 and the following Chemical Formula 3, or a combination thereof.

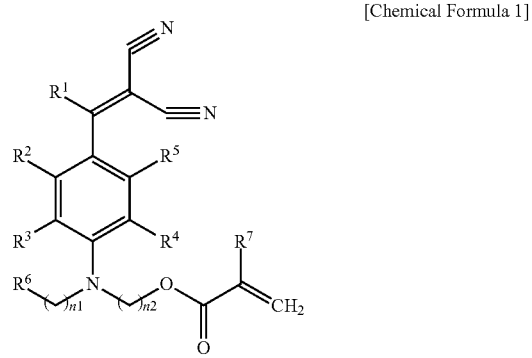

[Chemical Formula 1]

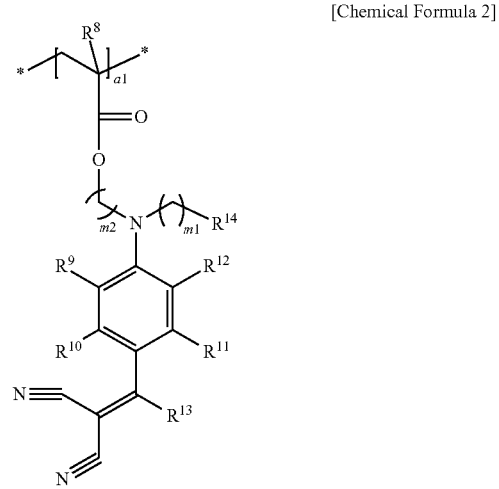

[Chemical Formula 2]

-continued

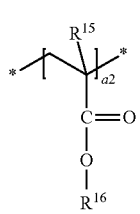

[Chemical Formula 3]

In the above Chemical Formulae 1 and 2, $R^1$ to $R^6$ and $R^9$ to $R^{14}$ are the same or different and are each independently hydrogen, substituted or unsubstituted C1 to C20 alkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

In the above Chemical Formulae 1 to 3, $R^7$, $R^8$ and $R^{15}$ are the same or different and are each independently hydrogen or substituted or unsubstituted C1 to C20 alkyl.

In the above Chemical Formula 3, $R^{16}$ is hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

In the above Chemical Formulae 1 and 2, $n^1$, $n^2$, $m^1$ and $m^2$ are the same or different and each may independently be integers of 1 to 10, for example, 1 to 6.

In the above Chemical Formulae 2 and 3, $a^1$ and $a^2$ are the same or different and each may independently be integers of 1 to 50, for example 1 to 30.

The compound represented by the above Chemical Formula 1 and the compound including repeating units represented by the above Chemical Formula 2 and Chemical Formula 3 may independently have a yellow color.

The compound including repeating units represented by the above Chemical Formula 2 and Chemical Formula 3 may be a copolymer obtained by polymerizing two kinds of monomers, or a copolymer obtained by polymerizing three or more kinds of monomers.

The compound including repeating units represented by the above Chemical Formula 2 and Chemical Formula 3 may have a weight average molecular weight of about 5,000 to about 20,000 g/mol, for example about 5,000 to about 15,000 g/mol, and as another example about 7,000 to about 12,000 g/mol. Within the above range of the weight average molecular weight, developability and cross-linking may be more improved.

The colorant may further include a dye in addition to the compound represented by the above Chemical Formula 1 and/or the compound including repeating units represented by the above Chemical Formula 2 and Chemical Formula 3. Examples of the dye may include without limitation triarylmethane-based dyes, anthraquinone-based dyes, benzylidene-based dyes, cyanine-based dyes, phthalocyanine-based dyes, azaporphyrin-based dyes, indigo-based dyes, xanthene-based dyes, and the like, and combinations thereof, as well as the compound represented by the above Chemical Formula 1 and the compound including repeating units represented by the above Chemical Formula 2 and Chemical Formula 3.

The colorant may further include a pigment. If the colorant further includes a pigment, luminance and contrast ratio may be more improved.

Examples of the pigment may include without limitation red pigments, green pigments, blue pigments, yellow pigments, and the like, and combinations thereof.

Examples of the red pigment may include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may include C.I. green pigment 36, C.I. green pigment 7, C.I. green pigment 58, and the like, and combinations thereof. Examples of the blue pigment may include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like, and combinations thereof. Examples of the yellow pigment may include without limitation isoindoline-based pigments such as C.I. yellow pigment 139, and the like, quinophthalone-based pigments such as C.I. yellow pigment 138, and the like, nickel complex pigments such as C.I. yellow pigment 150, and the like, and combinations thereof.

The pigment may be included in the photosensitive resin composition for a color filter as a dispersion. The pigment dispersion may include the pigment and solvent, a dispersing agent, a binder resin, and the like.

Examples of the solvent may include without limitation ethylene glycol acetate, ethyl cellosolve, propylene glycol methyl ether acetate, ethyl lactate, polyethylene glycol, cyclohexanone, propylene glycol methyl ether, and the like, and combinations thereof. In exemplary embodiments, propylene glycol methyl ether acetate may be used.

The dispersing agent helps to uniformly disperse the pigment. The dispersing agent may include a non-ionic, anionic, and/or cationic dispersing agent. Examples of the dispersing agent may include without limitation polyalkylene glycol and/or esters thereof, polyoxy alkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines, and the like. They may be used singularly or as a mixture of two or more.

The binder resin may include an acrylic-based resin including a carboxyl group. The acrylic-based binder resin may help improve pattern formation of pixels as well as stability of a pigment dispersion.

The pigment may have a primary particle diameter ranging from about 10 to about 70 nm. When the pigment has a primary particle diameter within the above range, pigment dispersion stability and resolution of pixels may be excellent.

There is no particular limit to the secondary particle diameter of the pigment. The pigment may have a secondary particle diameter of less than or equal to about 200 nm, for example, ranging from about 70 to about 100 nm, taking into account pixel resolution. The pigment may include ester, carboxylate salt, an alkyl amide alkylene oxide addition product, alkyl amine, and the like, which may be used singularly or in a mixture of two or more.

The binder resin may use an acryl-based resin including a carboxyl group and may improve pattern formation of pixels as well as stability of a pigment dispersion.

The photosensitive resin composition may include the colorant in an amount of about 0.1 to about 60 wt %, for example about 1 to about 40 wt %, based on the total weight of the photosensitive resin composition for a color filter. In some embodiments, the photosensitive resin composition may include the colorant in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the colorant can be in a range from about any of the foregoing amounts to about any other of the foregoing amounts.

When the colorant is used in an amount within the above range, high luminance and/or high contrast ratio in a desired color coordinate may be acquired.

(B) Binder Resin

The binder resin can be a copolymer of a first ethylenic unsaturated monomer and a second ethylenic unsaturated monomer that is copolymerizable with the first ethylenic unsaturated monomer, and may be a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The acrylic-based binder resin may include the first ethylenic unsaturated monomer in an amount ranging from about 5 to about 50 wt %, for example about 10 to about 40 wt %, based on the total amount (weight) of the acrylic-based binder resin. In some embodiments, the acrylic-based binder resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of two or more.

Examples of the binder resin may include without limitation methacrylic acid/benzylmethacrylate copolymers, methacrylic acid/benzylmethacrylate/styrene copolymers, methacrylic acid/benzyl methacrylate/2-hydroxyethylmethacrylate copolymers, methacrylic acid/benzyl methacrylate/styrene/2-hydroxyethylmethacrylate copolymers, and the like. They may be used singularly or as a mixture of two or more.

The binder resin may have a weight average molecular weight ranging from about 3000 to about 150,000 g/mol, for example about 5000 to about 50,000 g/mol, and as another example about 9,000 to about 30,000 g/mol. When the binder resin has a weight average molecular weight within the above range, the composition may have an excellent close contacting (adhesive) property with a substrate, good physical and chemical properties, and appropriate viscosity.

The binder resin may have an acid value ranging from about 15 to about 60 mgKOH/g, for example about 20 to about 50 mgKOH/g. When the binder resin has an acid value within the above range, it may bring about excellent pixel resolution.

The photosensitive resin composition may include the binder resin in an amount ranging from about 0.1 to about 30 wt %, for example about 3 to about 30 wt %, based on the total amount (weight) of the photosensitive resin composition for a color filter. In some embodiments, the photosensitive resin composition may include the binder resin in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, the composition may have an excellent developing property and improved cross-linking, and thus can provide excellent surface flatness when manufacturing a color filter.

(C) Photopolymerizable Monomer

The photopolymerization monomer may include a multifunctional monomer having two or more hydroxyl groups. Examples of the photopolymerization monomer may include without limitation glycerolacrylate, dipentaerythritolhexaacrylate, ethyleneglycoldiacrylate, triethyleneglycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenol A diacrylate, trimethylolpropanetriacrylate, novolacepoxyacrylate, ethyleneglycoldimethacrylate, diethyleneglycoldimethacrylate, triethyleneglycoldimethacrylate, propyleneglycoldimethacrylate, 1,4-butanedioldimethacrylate, 1,6-hexanedioldimethacrylate, and the like, and combinations thereof.

The photosensitive resin composition may include the photopolymerization monomer in an amount ranging from about 0.1 to about 30 wt %, for example about 5 to about 20 wt %, based on the total amount of the photosensitive resin composition. In some embodiments, the photosensitive resin composition may include the photopolymerization monomer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the photopolymerization monomer can be in a range from about any of the foregoing amounts to about any other of the foregoing amounts.

When the photopolymerization monomer is included in an amount within the above range, the composition may have excellent pattern characteristics and developing property.

(D) Photopolymerization Initiator

The photopolymerization initiator is one generally used for preparing a photosensitive resin composition for a color filter. Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphtol-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

The photopolymerization initiator may include a carbazole-based compound, a diketone-based compound, a sulfonium borate-based compound, a diazo-based compound, a biimidazole-based compound, and the like, or a combination thereof, in addition to or as an alternative to the aforementioned photopolymerization initiators.

The photosensitive resin composition may include the photopolymerization initiator in an amount ranging from about 0.1 to about 10 wt %, for example about 1 to about 5 wt %, based on the total amount (weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, the composition may be sufficiently photopolymerized when exposed to light during the pattern-forming process for preparing a color filter, and can accomplish excellent sensitivity and improve transmittance.

(E) Solvent

The solvent is not specifically limited. Examples of the solvent include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylethyl acetate, propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetate alkyl esters such as methyl oxyacetate, ethyl oxyacetate, butyl oxyacetate, and the like; alkoxy alkyl acetate esters such as methoxy methyl acetate, methoxy ethyl acetate, methoxy butyl acetate, ethoxy methyl acetate, ethoxy ethyl acetate, and the like; 3-hydroxy propionic acid alkyl esters such as 3-hydroxy methyl propionate, 3-hydroxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-hydroxy propionic acid alkyl esters such as 2-hydroxy methyl propionate, 2-hydroxy ethyl propionate, 2-hydroxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-hydroxy-2-methyl propionic acid esters such as 2-hydroxy-2-methyl methyl propionate, 2-hydroxy-2-methyl ethyl propionate, and the like; monooxy monocarboxylic acid alkyl esters of a 2-alkoxy-2-methyl propionic acid alkyl such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate; or ketonic acid esters such as ethyl pyruvate, and the like. Further examples of the solvent may include without limitation N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, carbonate ethylene, carbonate propylene, phenyl cellosolve acetate, and the like. These solvents may be used singularly or as a mixture thereof.

The solvent, considering miscibility, reactivity, and the like, may include glycol ethers such as ethylene glycol monoethyl ether and the like; ethylene glycol alkylether acetates such as ethyl cellosolve acetate and the like; esters such as 2-hydroxy ethyl propionate and the like; diethylene glycols such as diethylene glycol monomethyl ether and the like; or propylene glycol alkylether acetates such as propylene glycol monomethylether acetate, propylene glycol propylether acetate, and the like; and combinations thereof.

The photosensitive resin composition may include the solvent in a balance amount, for example, in an amount ranging from about 20 to about 90 wt %, based on the total amount (weight) of the photosensitive resin composition for a color filter. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have excellent coating properties and maintain improved flatness in a layer having a thickness of greater than or equal to about 3 μm.

(F) Surfactant

The photosensitive resin composition for a color filter may further include a surfactant to uniformly disperse the pigment into the solvent and to improve leveling performance.

The surfactant may include a fluorine-based surfactant and/or a silicone-based surfactant.

Examples of the fluorine-based surfactant may include without limitation F-482, F-484, F-478, and the like, and combinations thereof made by DIC Co., Ltd.

Examples of the silicone-based surfactant may include without limitation TSF400, TSF401, TSF410, TSF4440, and the like, and combinations thereof made by Toshiba silicone Co., Ltd.

The photosensitive resin composition may include the surfactant in an amount ranging from about 0.01 to about 5 parts by weight, for example, from about 0.1 to about 2 parts by weight, based on about 100 parts by weight of the photosensitive resin composition for a color filter. When the surfactant is included in an amount within the above range, the composition may have fewer impurities generated after the development.

(G) Other Additive(s)

The photosensitive resin composition for a color filter may further include one or more other additives. Examples of the additives may include without limitation malonic acid, 3-amino-1,2-propanediol, vinyl- or (meth)acryloxy-containing silane-based coupling agents, and the like, and combinations thereof, in order to prevent stains or spots during the coating, to adjust leveling, and/or to prevent pattern residue due to non-development. The amount of the additives used may be adjusted depending on desired properties.

In addition, the photosensitive resin composition for a color filter may further include an epoxy compound to improve the close contacting (adhesive) property and other characteristics if needed.

Examples of the epoxy compound may include without limitation epoxy novolac acrylic carboxylate resins, ortho cresol novolac epoxy resins, phenol novolac epoxy resins, tetra methyl biphenyl epoxy resins, bisphenol A-type epoxy resins, alicyclic epoxy resins, and the like, and combinations thereof.

The method of preparing of the photosensitive resin composition for a color filter is not specifically limited. The photosensitive resin composition for a color filter may be prepared by mixing the aforementioned colorant, acrylic-based binder resin, photopolymerization initiator, photopolymerization monomer, and solvent, and optionally the additive(s).

According to another embodiment, provided is a color filter manufactured using the photosensitive resin composition for a color filter.

This color filter may be manufactured using any suitable conventional method. For example, the photosensitive resin composition can be applied to a substrate using any suitable method such as but not limited to spin-coating, roller-coating, slit-coating, and the like to provide a coating or layer with a thickness ranging from about 1.5 to about 2.0 μm. After the coating step, the layer can be radiated with (exposed to) a UV ray, an electron beam, or an X-ray to form a pattern required for a color filter. The UV ray may have a wavelength region ranging from about 190 to about 450 nm, for example about 200 to about 400 nm. Then, when the coated layer is treated with an alkali developing solution, the unradiated (unexposed) region thereof may be dissolved, forming a pattern for an image color filter. This process can be repeated depending on the necessary number of R, G, and B colors, fabricating a color filter having a desired pattern. In addition, the image pattern acquired by the development can be cured through heat treatment, actinic ray radiation, and the like, to improve crack resistance, solvent resistance, and the like.

Hereinafter, the present invention is illustrated in more detail with reference to examples. These examples, however, are not in any sense to be interpreted as limiting the scope of the invention.

Preparation Example 1

A compound represented by the following Chemical Formula 4 and benzylmethacrylate are used in a weight ratio of 3:7, 10 parts by weight of 2,2'-azobis (2,4-dimethylvaleronitrile) as a photopolymerization initiator based on 100 parts by weight of the total weight of the two monomers is added thereto, 200 parts by weight of propyleneglycol monomethyl ether acetate based on 100 parts by weight of the total weight of the two monomers is added thereto, and then, the mixture is slowly agitated under a nitrogen atmosphere. The solution is heated up to 75° C. and then, agitated for 8 hours again, preparing a compound including a structural unit represented by the following Chemical Formula 5. Herein, the compound including a structural unit represented by the following Chemical Formula 5 has a weight average molecular weight of 10,000 g/mol.

[Chemical Formula 4]

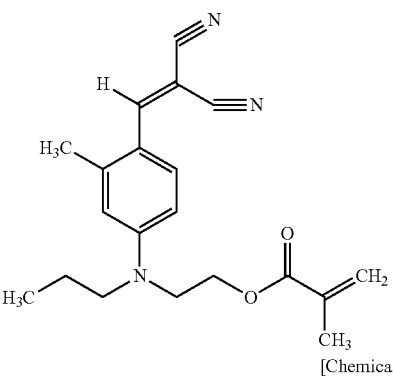

[Chemical Formula 5]

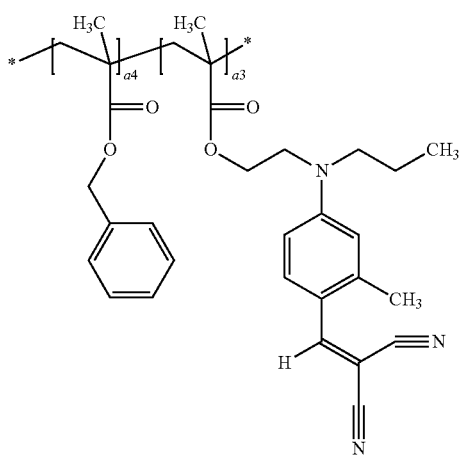

In above Chemical Formula 5, $a^3$ and $a^4$ are 30 and 10, respectively.

(Preparation of Photosensitive Resin Composition for Color Filter)

Photosensitive resin compositions are prepared using the following components.

(A) Colorant (A-1) Dye (A-1-1) A compound represented by the above Chemical Formula 4 is used.

(A-1-2) The compound including a structural unit represented by the above Chemical Formula 5 according to Preparation Example 1 is used.

(A-1-3) A dye, Yellow 17 made by LANXESS Co. as a compound represented by the following Chemical Formula 6 is used.

[Chemical Formula 6]

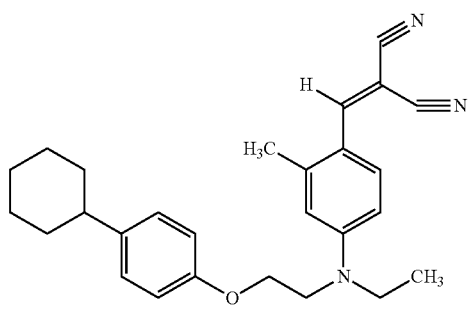

(A-1-4) Dye R008 made by Kyung-In Synthetic Co. is used.

(A-1-5) Dye R037 made by Kyung-In Synthetic Co. is used.

(A-2) Pigment

Yellow 150 made by LANXESS Co. is used.

(B) Binder Resin

A methacrylic acid/benzylmethacrylate copolymer (w/w=30/70) having a weight average molecular weight of 28,000 g/mol is used.

(C) Photopolymerizable Monomer

Dipentaerythritolhexaacrylate is used.

(D) Photopolymerization Initiator

OXE01 made by BASF Co. is used.

(E) Solvent

Propylene glycol monomethyl ether acetate is used.

(F) Surfactant

A fluorine-based surfactant, F-475 of DIC Co., Ltd. is used.

Examples 1 and 2 and Comparative Examples 1 and 2

Photosensitive resin compositions for a color filter are prepared by mixing each component according to the compositions provided in the following Table 1. Specifically, a photopolymerization initiator is dissolved in a solvent, the solution is agitated at room temperature for 2 hours, a colorant is added thereto, the mixture is agitated for 30 minutes, a binder resin and a photopolymerizable monomer are added thereto, and the resultant is agitated at room temperature for 2 hours. A surfactant is added to the agitated mixture, and the resultant is agitated again at room temperature for one hour. The solution is three times filtered to remove impurities, obtaining photosensitive resin compositions for a color filter.

TABLE 1

| | | (wt %) | | | |
|---|---|---|---|---|---|
| | | Examples | | Comparative Examples | |
| | | 1 | 2 | 1 | 2 |
| (A) Colorant | (A-1-1) | 1.0 | — | — | — |
| | (A-1-2) | — | 1.0 | — | — |
| | (A-1-3) | — | — | — | 1.0 |
| | (A-1-4) | 3.0 | 3.0 | 3.0 | 3.0 |
| | (A-1-5) | 1.0 | 1.0 | 1.0 | 1.0 |
| | (A-2) | — | — | 1.0 | — |
| (B) Binder resin | | 3.0 | 3.0 | 3.0 | 3.0 |
| (C) Photopolymerizable monomer | | 7.0 | 7.0 | 7.0 | 7.0 |
| (D) Photopolymerization initiator | | 2.0 | 2.0 | 2.0 | 2.0 |
| (E) Solvent | | 82.5 | 82.5 | 82.5 | 82.5 |
| (F) Surfactant | | 0.5 | 0.5 | 0.5 | 0.5 |

(Pattern Formation for Color Filter)

The photosensitive resin compositions for a color filter according to Examples 1 and 2 and Comparative Examples 1 and 2 are coated to be 2.5 to 3.5 μm thick on a 1 mm-thick fat-removed and washed glass substrate using a spin-coating method and pre-baked on a hot plate at 90° C. for 3 minutes. The coated substrate is cooled down under the atmosphere and radiated by radiating a UV ray having a wavelength of 365 nm by using a high pressure mercury lamp with an exposure dose of 100 mJ/cm², forming thin films. The thin films are post-baked in a hot air drier at 230° C. for 30 minutes to obtain cured thin films.

Evaluation 1: Luminance and Contrast Ratio of Thin Film

The color coordinate, luminance, and contrast ratio of the thin films according to Examples 1 and 2 and Comparative Examples 1 and 2 are measured using the following methods. The results are provided in the following Table 2.

(1) Color coordinate (x and y) and Luminance Y: measured by using a spectrophotometer (MCPD 3000, Otsuka Electronics Co., Ltd.).

(2) Contrast ratio: measured by using a contrast ratio measuring device (30,000:1, CT-1, Tsubosaka electronic Co., Ltd.).

Evaluation 2: Heat Resistance of Thin Film

The thin film specimens according to Examples 1 and 2 and Comparative Exampled 1 and 2 are three times repetitively put in and taken out in an oven at 220° C. and dried. Then, the color difference before/after the experiment is measured with a spectrophotometer and the color difference is converted into del(E*). The evaluation is performed based on the following three criteria, and the results are provided in the following Table 2.

○: No pattern change and del (E*) of less than 2.5

: A little pattern change or del (E*) ranging from greater than or equal to 2.5 less than 3.5 x: Pattern change or del (E*) of greater than or equal to 3.5

Evaluation 3: Chemical Resistance of Thin Film

The thin film specimens according to Examples 1 and 2 and Comparative Examples 1 and 2 are dipped in a mixed solvent of N-methylpyrrolidone (NMP) and ethylene diglycoldimethylethylether (EDM) at room temperature for 10 minutes and dried. Then, the color difference before/after the experiment is measured using a spectrophotometer and the color difference is converted into del(E*). The evaluation is performed based on the following three criteria, and the results are provided in the following Table 2.

○: No pattern change and del(E*) of less than 2.5

: A little pattern change or del(E*) ranging from greater than or equal to 2.5 less than 3.5 x: Pattern change or del(E*) of greater than or equal to 3.5

TABLE 2

|  | Color coordinate | | Luminance | Contrast | Heat | Chemical |
| --- | --- | --- | --- | --- | --- | --- |
|  | x | y | Y | ratio | resistance | resistance |
| Example 1 | 0.657 | 0.326 | 18.7 | 17,100 | ○ | ○ |
| Example 2 | 0.657 | 0.324 | 19.0 | 17,200 | ○ | ○ |
| Comparative Example 1 | 0.657 | 0.323 | 18.4 | 17,200 |  |  |
| Comparative Example 2 | 0.657 | 0.327 | 18.5 | 17,100 | x | x |

Referring to Table 2, the thin films including a colorant according to Examples 1 and 2 have very excellent luminance and equivalent or better contrast ratio, heat resistance, and chemical resistance compared with the thin films according to Comparative Examples 1 and 2.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising (A) a colorant including a compound represented by the following Chemical Formula 1, a compound including repeating units represented by the following Chemical Formula 2 and the following Chemical Formula 3, or a combination thereof;

(B) a binder resin;

(C) a photopolymerizable monomer;

(D) a photopolymerization initiator; and (E) a solvent:

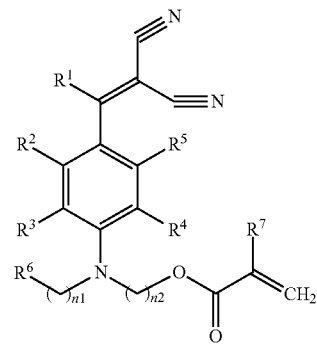

[Chemical Formula 1]

-continued

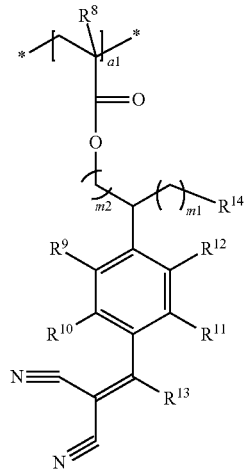

[Chemical Formula 2]

-continued

[Chemical Formula 3]

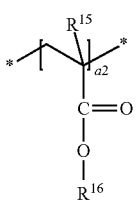

wherein, in the above Chemical Formulae 1 to 3, $R^1$ to $R^6$ and $R^9$ to $R^{14}$ are the same or different and are each independently hydrogen, substituted or unsubstituted C1 to C20 alkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^7$, $R^8$ and $R^{15}$ are the same or different and are each independently hydrogen or substituted or unsubstituted C1 to C20 alkyl, $R^{16}$ is hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $n^1$, $n^2$, $m^1$ and $m^2$ are the same or different and are each independently integers ranging from 1 to 10, and $a^1$ and $a^2$ are the same or different and are each independently integers ranging from 1 to 50.

2. The photosensitive resin composition for a color filter of claim 1, wherein the compound including repeating units represented by the above Chemical Formula 2 and Chemical Formula 3 has a weight average molecular weight of about 5,000 to about 20,000 g/mol.

3. The photosensitive resin composition for a color filter of claim 1, wherein the colorant further comprises a dye comprising a triarylmethane-based dye, an anthraquinone-based dye, a benzylidene-based dye, a cyanine-based dye, a phthalocyanine-based dye, an azaporphyrin-based dye, an indigo-based dye, a xanthene-based dye, or a combination thereof.

4. The photosensitive resin composition for a color filter of claim 1, wherein the colorant further comprises a pigment.

5. The photosensitive resin composition for a color filter of claim 1, wherein the photosensitive resin composition for a color filter comprises:
  about 0.1 to about 60 wt % of the colorant (A);
  about 0.1 to about 30 wt % of the binder resin (B);
  about 0.1 to about 30 wt % of the photopolymerizable monomer (C);
  about 0.1 to about 10 wt % of the photopolymerization initiator (D); and
  a balance amount of the solvent (E).

6. A color filter manufactured using the photosensitive resin composition for a color filter of claim 1.

* * * * *